United States Patent [19]

Alfano

[11] Patent Number: 5,486,763
[45] Date of Patent: Jan. 23, 1996

[54] METHOD TO DISPLAY WITH COMBINED COLOR MULTIPLE QUANTITATIVE IMAGES OF TISSUE PARAMETERS OBTAINED WITH NUCLEAR MAGNETIC RESONANCE

[75] Inventor: Bruno Alfano, Naples, Italy

[73] Assignee: Consiglio Nazionale delle Ricerche, Italy

[21] Appl. No.: 204,421

[22] PCT Filed: Sep. 9, 1992

[86] PCT No.: PCT/IT92/00112

§ 371 Date: Apr. 11, 1994

§ 102(e) Date: Apr. 11, 1994

[87] PCT Pub. No.: WO93/05405

PCT Pub. Date: Mar. 18, 1993

[30] Foreign Application Priority Data

Sep. 12, 1991 [IT] Italy .................. RM91A0680

[51] Int. Cl.$^6$ .................... G01R 33/48
[52] U.S. Cl. .................... 324/309; 324/307
[58] Field of Search .................... 324/307, 309, 324/300, 312, 314; 128/653.2, 653.5

[56] References Cited

U.S. PATENT DOCUMENTS 4,789,831  12/1988  Mazo, Jr. .................. 324/309
5,332,968  7/1994  Brown .................. 324/309

FOREIGN PATENT DOCUMENTS 0112582   7/1984   European Pat. Off. .
0213666   11/1987  European Pat. Off. .
3832973   4/1989   Germany .
62-049216 8/1987   Japan .

OTHER PUBLICATIONS

Klamman et al, "Unified Multiple Feature Color Display for MR Images", Mag Res in Med vol. 9 No. 2 (Feb. 1989).

Kuhn et al, "Interactive MR Image Synthesis" Phillips Tech Rev vol. 43 No. 4 pp. 95–103 (Feb. 1987).

Primary Examiner—Sandra L. O'Shea
Assistant Examiner—Raymond Y. Mah
Attorney, Agent, or Firm—Banner & Allegretti, Ltd.

[57] ABSTRACT

A method to display with combined color multiple quantitative images of tissue parameters obtained with nuclear magnetic resonance. The method allows an increased diagnostic accuracy, a higher sensitivity to pathologies of small extent, a standardization of acquisition sequences and a shortening of the total line required for performing the examination to be realized.

8 Claims, No Drawings

METHOD TO DISPLAY WITH COMBINED COLOR MULTIPLE QUANTITATIVE IMAGES OF TISSUE PARAMETERS OBTAINED WITH NUCLEAR MAGNETIC RESONANCE

BACKGROUND OF THE INVENTION

This invention relates to a method to display with combined color quantitative images of tissue parameters obtained with nuclear magnetic resonance (quantitative magnetic color imaging, QMCI).

More particularly, this invention relates to a method to synthetically represent tissue parameters by means of pseudonatural color images to be employed with nuclear magnetic resonance.

The documents mentioned herein with a reference numeral are listed at the end of this disclosure.

Nuclear magnetic resonance (NMR) or magnetic resonance imaging (MRI) is largely employed for tissue investigations for diagnostic purposes (1).

The signal obtained in spin-echo sequences, which are those most commonly employed in NMR 1) $S = KN(H)[1 - e^{-TR/T1}(2e^{TE/2T1} - 1)]e^{-TE/T2}$ wherein: by the symbol S=spin-echo signal in the NMR acquisition sequences are meant, said sequences consisting in the repetition of a set of two radiofrequency pulses, which are called the 90° and 180° pulses, the set being characterized by the time of repetition TR equal to the interval between the 90° pulses and by the time of echo TE which is equal to twice the distance between the 90° and the 180° pulse, that generates a NMR signal which is called the echo at an interval TE from the 90° pulse; T1 and T2 are the longitudinal and transverse relaxation times which are characteristic for the voxel of the tissue to be analyzed, N(H) is the number of the hydrogen atoms, TR and TE are the repetition time and the echo time respectively that characterize the sequence of pulses which is employed for the acquisition of the image, K is an efficiency constant that varies with the experimental conditions. The voxel is the volume element that contributes to the formation of the image element.

The expression 1) does not take into account second-order effects such as diffusion, chemical shift etc. The NMR image is thus not like the X-ray computerized tomography (CT), a map of one only physical parameter (e.g. the electronic density), but it is a function of a number of parameters that characterize the tissue under examination. The main parameters among those mentioned above are the T1 and the T2. The proton density, which is a signal multiplication factor, in most soft tissues has an almost constant value, so that it is not a significative parameter as far as the tissue characterization is concerned.

Users of such methodologies, in order to formulate a diagnosis, carry out at present a number of acquisition sequences of said tissues varying the TR and the TE so as to obtain a number of images with different weights of T1 and T2. Thus a global evaluation is performed of such parameters or of parameters depending on them. Such evaluation is not absolute, but it is relative to reference tissues such as fatty parts, muscles, the brain parenchyma, the cerebrospinal fluid, and so on. The remainder of the diagnostic information comes from the morphology of the observed tissues. Moreover, it is to be remarked from the expression 1) that in the NMR image the T2 gives a direct contribution to the formation of the signal, whereas the T1 gives an inverse contribution. Accordingly, with the same values of T1, tissues having a longer T2 show brighter than tissues having a shorter T2, whereas with the same values of T2, tissues having a longer T1 show darker than those having a shorter T1. Such king of representation which is that usually employed in the present NMR technology is not necessarily the best one from the diagnostic standpoint.

Methods for the production of color images as applied also to magnetic resonance are disclosed in the technical literature, but in many cases the images employed are those of the MR signal (2–5). In order to modulate with different information the chromatic components of color images, different acquisition sequences are employed. The results are not much reproducible, and in addition they are difficult to interpret and of poor iconographic quality.

Setting forth in advance that by the term pixel it is to be understood the image element, i.e. the matrix element which is represented in the form of an image, it is possible to calculate pixel by pixel the value of T2 (6) from a multiecho sequence (the TR value is constant while a number of images with different TE values is obtained), so obtaining an image of that parameter. In the same way, carrying out two sequences at equal TE but with different TR, it is possible to obtain an image of T1 by numerical computation. Such images, which are available on almost all commercial tomographic devices for MRI, are not much employed because of the following reasons:

1) the type of representation that stems from them is somewhat unnatural, as it is inverted with respect to the anatomic representation of the magnetic resonance signal;

2) the distribution of the values of the parameters lowers the contrast between some tissues whereas it amplifies such contrast for other ones to a large extant;

3) images show somewhat noisy in the background zones so that they are of poor iconographic quality.

The employment of parametric images or maps of a parameter is quite common in "Diagnostic Imaging" though the clinical applications are rare. The maps of the longitudinal and transverse relaxation times T1 and T2 are rarely employed in magnetic resonance techniques, but many commercial types of tomographic apparatuses are supplied with programs for their production.

Three prior art documents disclose methods for simultaneous display of relaxation times (T1 and T2) with color images: Kuhn M. H. and Menhardt W. (7) describe a method wherein color images are obtained by superimposing monochromatic (green, red and blue) parameter images of T1, T2 and proton density; Kamman R. L. et al. (8) describe a method wherein the color, defined as hue and saturation, of each pixel is computed from T1 and T2 using an algoritm based on a reference color triangle, and wherein the luminance is modulated by proton density; U.S. Pat. No. 4,789,831, describes a method wherein the magnetic resonance spin echo intensity is used to modulate the intensity of each pixel, and either T1 or T2 are used to define hue and saturation. As stated above, a poor iconographic quality is obtained where said parameters are used. The relaxation rates R1 and R2, which are defined respectively as VT1 and VT2, have never been employed, and no parameteric images have been produced for clinical purposes.

Bibliographic references known to the Author include:

1. Morris P. G. Nuclear Magnetic Resonance Imaging in Medicine and Biology, Clarendon Press, Oxford (1986).

2. Weiss K. L. et al. American J. Radiol, 149, 825–829 (1987).

3. Vannier M. W. and Douglas R. Current Concepts 24, 88–91 (1989).

4. Vannier M. W. et al. CRC Critical Rev. in Biomed. Engineering 15, 117–144 (1987).

5. Wells M. G. et al. Med. Biol. Eng. Comput. 27, 277–280 (1989).

6. Romano F. et al. XIV Congress Europ. Society of Neuroradiology, Udine Italy (1987).

7. M. H. Kuhn and W. Menhardt, Interactive MR Image Synethesis, Philips Tech. Rev. 43, No. 4,95–103, Feb. 1987.

8. R. L. Kamman, G. Stomp, H. J. C. Berendesen, Unified Multiple-Feature Color Display for MR Images, Magnetic Resonance in Medicine), 240–253 (1989).

Such parametric images have on the contrary a diagnostic validity which results in the advantageous substitution of them for the signal images on whose basis the diagnosis is formulated at present.

The Author of this invention has found how to exploit the intrinsic multiparametric character of the magnetic resonance signal, as well as how to exploit some features of color perception, and in particular the property according to which all colors can be obtained from suitable combination of red, green and blue light and, apart from saturation phenomena, two colors obtained by summing combinations of intensities of the three chromatic components are distinguishable if at least one chromatic component has a distinguishable intensity in the two combinations. Accordingly, color allows two or three different monochromatic images of different colors to be represented simultaneously, with no information loss, by simply overlapping such images, or otherwise by projecting them simultaneously on the same screen (a videoprojector or a color monitor with RGB colorimetric coding).

As the main parameters that characterize the tissue can be obtained from the common magnetic resonance techniques, a chromatic characterization of the tissues is obtained through the association of the intensity of a chromatic component to the value of each parameter and overlapping the components pixel by pixel. The result consists of a single image in which the tissues can be recognized by their "magnetic color", besides their own shape. It is evident that the result also depends on the physical parameters represented. The Author has checked various parameters and he has found that not only the longitudinal and the transverse relaxation rates supply parametric images of anatomic type, with "diagnostic" distribution of the contrasts and with very low noise, but the employment of the red and chromatic component for the longitudinal relaxation constant and of the green (or, better, the green+blue) chromatic component for the transverse relaxation constant gives images with almost natural color of the various tissues, and hence images of rapid and easy interpretation even for unskilled personnel. The technique can also be extended to three parameters, as for instance the proton density or other parameters that can be obtained from MRI (flow, diffusion, perfusion and so on) can be represented by the blue chromatic component.

Moreover, quantitative digital images can be obtained by such procedure which, compared to a two-dimensional chromatic scale supply the chromatic characterization of tissues while, through direct reading on regions of interest, they supply the values of the longitudinal and the transverse relaxation rates (and hence of the times T1 and T2 ) of the tissues so visualized.

The synthetic representation of NMR information avoids a complex and inaccurate mental evaluation on the user's side, such evaluation consisting in estimating, from the various images of the same section, the tissue parameters of a determined tissue, which is identified by shape, position or different intensity with respect to the tissues around the same. Once such parameters have been evaluated, the corresponding tissue type can be determined. By means of the process which is the object of this invention, the association in question is just the color-tissue association, while the values of the relaxation parameters can be read directly on the image shown on the monitor by means of a standard reading technique through a cursor or the definition of a region of interest.

Accordingly, it is possible to obtain:

a better diagnostic accuracy, because the calculation of the tissue parameters if extremely more precise than the subjective evaluation performed by the user, and because it is possible to distinguish tissues with very small differencies in the relaxation constants;

an increased sensitivity to small pathologies. Indeed, some small zones of altered signal quite often are not noticed in black-and-white images or they are mistaken for acquisition artifacts. On the contrary, in the chromatic reconstruction, the evidence of the characteristic color attracts the attention of the user even to very small anomalies;

a standardization of the acquisition sequences and a reduction in the total time required for performing the examination.

Indeed, the acquisition sequences are chosen at present from time to time according to the suspected pathology in order to increase the contrast between the pathological tissues and those around the same. By means of the chromatic technique, the acquisition sequences can be standardized in order to optimize the color image in terms of signal/noise ratio. The decision times required at present between an acquisition sequence and the next one are thus shortened.

Accordingly, it is an object of this invention a method for representing tissue parameters in nuclear magnetic resonance (NMR), said method comprising a synthetic representation step of said parameters by means of combined color images. Preferably, said synthetic representation comprises the step of overlapping at least two images obtained with different and independent chromatic scales.

DETAILED DESCRIPTION OF THE PRESENT INVENTION

According to a preferred embodiment of this invention, said overlapping step of said images comprise:

partition of the pixel bit depth into at least two partitions;

compression of the parametric images onto the bit number of each partition;

assigning a bit partition to each parametric image;

composition of a single matrix (with bit depth equal to the sum of bits of the various partitions) in which the images are overlapped;

employment of a chromatic scale according to the RGB colorimetric coding, in which the intensity changes of each single chromatic component are modulated exclusively by the bits assigned to that component and independently of the intensity changes of the other component.

According to a preferred embodiment of this invention, said tissue parameters are represented by physical parameters, preferably by the longitudinal relaxation constant $R1$ and the transverse relaxation constant $R2$, which are defined by the formulas $R1=1/T1$ and $R2=1/T2$, wherein $T1$ and $T2$ are respectively the longitudinal and transverse relaxation times which are characteristic of the voxel, or of the volume element that contributes to the formation of the image element. Preferably said $R1$ is represented by the red or red-orange chromatic component, and R2 is represented by the green chromatic component, and even more preferably by the green-blue component.

According to a preferred embodiment of this invention, said tissue parameters comprise, besides R1 and R2, also at least one parameter selected from among the proton density, the flow, diffusion and perfusion.

Again according to this invention, said method of representation of tissue parameters in NMR, comprises the quantitative measurement step of said color images.

This invention will be disclosed in the following with reference to some application examples of the same which are not to be taken as limitations imposed on the invention itself.

EXAMPLE 1

A calculation program has been developed which allows parametric images to be obtained, with various NMR constants, which are characteristic of tissues, starting from standard spin-echo images. In particular, parametric images are obtained of the longitudinal relaxation constants R1 (=1/T1), of the transverse relaxation constant R2 (=1/T2) and of the product of the proton density (N(H)) for the afficiency constant K, from images of the same tissue layer, coming from a multiecho sequence and from a spin-echo sequence, with TE equal to the minimum values of the multiecho TE and with a different value of TR. From the only multiecho sequence, images of the R2 and approximate images of the R1 can be obtained. Indeed, on the hypothesis that the proton density is constant. If the value of T2 is known, the value of R1 can be obtained from the expression 1). Finally, from the multiecho sequence the partial saturation (PS) image can be obtained, i.e. the image that would be obtained by means of a sequence with the same multiecho TR and with TE equal to 0.

The procedure employed for overlapping the parametric images is as follows:

1) the pixel bit depth is partitioned into 2 or 3 partitions according to whether two or three chromatic components are desired for employment, i.e. according to whether the user wants to represent two or three parameters. The partitions will be made up of N and M or of N, M and P bits.

2) The parametric images are compressed onto the bit number of each partition.

3) A bit partition is assigned to each parametric image, and images are written into the assigned partitions of the graphic storage.

4) A chromatic scale is employed which is so realized that: the chromatic component assigned to the N bits which are least significative goes from 0 to the maximum value in the first $2^N$ levels (in the case mentioned, the first 16 levels), in the second $2^M$ levels, and so on. The chromatic component assigned to the M successive bits is constant until the first component changes and increases each time the first component becomes null, going from 0 to the maximum value in the first $2^{N+M}$ levels (in the case mentioned, in all 256 levels that can be visualized); in the case of a third chromatic component assigned to the P successive bits, it increases each time the second component becomes 0 and goes from 0 to the maximum value on the $2^{N+M+P}$ levels.

The procedure has been widely employed by the Author of this invention in various cases of brain pathologies.

This invention has been disclosed with specific reference to some preferred embodiments of the same, but it is to be understood that modifications and/or changes can be introduced in the same by those who are skilled in the art without departing from the spirit and scope of the invention for which a priority right is claimed.

I claim:

1. A method of representation of physical tissue parameters in nuclear magnetic resonance (NMR), said method comprising a step of simultaneous representation of said parameters as combined color images, said color images being the result of overlapping of a least two parametric images obtained with chromatic scales different from one another and independent of one another, said physical tissue parameters comprise the longitudinal relaxation constant R1 and the transverse relaxation constant R2, which are defined by the formulas R1=1/T1 and R2=1/T2, wherein T1 and T2 are respectively the longitudinal and the transverse relaxation times that are characteristic of the voxel.

2. A method of representation of physical tissue parameters in nuclear magnetic resonance (NMR) according to claim 1 wherein R1 is represented by the red chromatic component, and R2 is represented by the green component.

3. A method of representation of physical tissue parameters in nuclear magnetic resonance (NMR) according to any one of the preceding claims, characterized in that said tissue parameters comprise, in addition to R1 and R2, also at least one parameter selected from the following: proton density, flow, diffusion, perfusion.

4. A method of representation of physical tissue parameters in nuclear magnetic resonance (NMR) according to claim 1 wherein R1 is represented by the red-orange chromatic component.

5. A method of representation of physical tissue parameters in nuclear magnetic resonance (NMR) according to claim 1 wherein R2 is represented by the green-blue chromatic component.

6. A method of representation of physical tissue parameters in nuclear magnetic resonance (NMR) according to claim 1 where R1 is represented by the red chromatic component.

7. A method of representation of physical tissue parameters in nuclear magnetic resonance (NMR) according to claim 1 where R2 is represented by the green chromatic component.

8. A method of representation of physical tissue parameters in nuclear magnetic resonance (NMR), said method comprising a step of simultaneous representation of said parameters as combined color images, said color images being the result of overlapping of at least parametric images obtained with chromatic scales different from one another and independent of one another, said physical tissue parameters comprise the longitudinal relaxation constant R1 and the transverse relaxation constant R2, which are defined by the formulas R1=1/T1 and R2=1T2, wherein T1 and T2 are respectively the longitudinal and the transverse relaxation times that are characteristic of the volume element that contributes to the formation of the image element.

* * * * *